(12) United States Patent
Kim et al.

(10) Patent No.: US 10,448,499 B2
(45) Date of Patent: Oct. 15, 2019

(54) FLEXIBLE PRINTED CIRCUIT BOARD WITH NARROWER LINE WIDTH

(71) Applicant: GigaLane Co., Ltd., Hwaseong-si, Gyeonggi-do (KR)

(72) Inventors: Sang Pil Kim, Hwaseong-si (KR); Byung Hoon Jo, Hwaseong-si (KR); Da Yeon Lee, Hwaseong-si (KR); Byung Yeol Kim, Hwaseong-si (KR); Hee seok Jung, Hwaseong-si (KR)

(73) Assignee: GigaLane Co., Ltd., Hwaseong-si, Gyeonggi-Do (KR)

( * ) Notice: Subject to any disclaimer, the term of this patent is extended or adjusted under 35 U.S.C. 154(b) by 0 days.

(21) Appl. No.: 16/224,965

(22) Filed: Dec. 19, 2018

(65) Prior Publication Data

US 2019/0230785 A1    Jul. 25, 2019

(30) Foreign Application Priority Data

Jan. 25, 2018    (KR) .................. 10-2018-0009433

(51) Int. Cl.
*H05K 1/02* (2006.01)
*H05K 1/18* (2006.01)

(52) U.S. Cl.
CPC .......... *H05K 1/0222* (2013.01); *H05K 1/028* (2013.01); *H05K 1/189* (2013.01); *H05K 2201/09327* (2013.01)

(58) Field of Classification Search
CPC ............... H05K 1/0222; H05K 2201/09327
See application file for complete search history.

(56) References Cited

U.S. PATENT DOCUMENTS

| | | | | |
|---|---|---|---|---|
| 7,339,260 | B2 * | 3/2008 | Sugimoto | H05K 1/0251 174/260 |
| 7,868,257 | B2 * | 1/2011 | Kushta | H05K 1/0222 174/262 |
| 9,107,300 | B2 * | 8/2015 | Kushta | H05K 1/0222 |
| 9,401,531 | B2 * | 7/2016 | Iida | H01P 3/08 |
| 9,860,985 | B1 * | 1/2018 | Ajoian | H05K 1/0222 |
| 2004/0217830 | A1 * | 11/2004 | Hansen | H01P 1/047 333/246 |
| 2017/0250466 | A1 * | 8/2017 | Schlaffer | H01Q 1/38 |
| 2018/0206332 | A1 * | 7/2018 | Kim | H05K 1/115 |

FOREIGN PATENT DOCUMENTS

| | | |
|---|---|---|
| KR | 1020060035171 A | 4/2006 |
| KR | 101507268 B1 | 3/2015 |
| KR | 101535447 B1 | 7/2015 |
| KR | 1020160135453 A | 11/2016 |
| KR | 1020170036364 A | 4/2017 |
| WO | 2013099609 A1 | 7/2013 |

* cited by examiner

*Primary Examiner* — Hung V Ngo
(74) *Attorney, Agent, or Firm* — Brundidge & Stanger, P.C.

(57) ABSTRACT

In one example, a flexible circuit board includes a signal line disposed between a first ground and a second ground; a dielectric disposed between the first ground and the signal line and between the second ground and the signal line; and via holes formed by filling a plurality of holes, which are formed in a vertical direction such that the first ground and the second ground are electrically connected, with conductors, wherein the signal line is laterally bent so as to be spaced apart from positions where the via holes are formed.

6 Claims, 6 Drawing Sheets

FLEXIBLE PRINTED CIRCUIT BOARD WITH NARROWER LINE WIDTH

CROSS-REFERENCE TO RELATED APPLICATION

This application claims the benefit under 35 U.S.C. § 119 of a Korean patent application No. 10-2018-0009433 filed on Jan. 25, 2018 in the Korean Intellectual Property Office, the entire disclosure of which is hereby incorporated herein by reference.

TECHNICAL FIELD

The embodiments described herein pertain generally to a flexible circuit board used for transmitting a high frequency signal.

BACKGROUND

Generally, a transmission line for transmitting a high frequency signal is provided in wireless devices such as a smartphone and a tablet personal computer (PC).

Conventionally, a coaxial cable has been mainly used as the transmission line. However, recently, due to a miniaturization trend of wireless devices, an interior space of the wireless devices has gradually become narrower. Thus, a flexible circuit board occupying a smaller space compared to the coaxial cable has been used.

In addition to the miniaturization trend of wireless devices, various functions are added to wireless devices, and an interior space of the wireless devices becomes further narrower. In response to such a trend, there is a need to develop a more miniaturized flexible circuit board.

SUMMARY

The present invention has been made to solve the above-mentioned problems and is directed to providing a flexible circuit board miniaturized by minimizing a line width.

In one example embodiment, a flexible circuit board with a reduced line width includes: a signal line disposed between a first ground and a second ground; a dielectric disposed between the first ground and the signal line and between the second ground and the signal line; and via holes formed by filling a plurality of holes, which are formed in a vertical direction such that the first ground and the second ground are electrically connected, with conductors, wherein the signal line is laterally bent so as to be spaced apart from positions where the via holes are formed.

In another example embodiment, a flexible circuit board with a reduced line width includes: a signal line disposed between a first ground and a second ground; a dielectric disposed between the first ground and the signal line and between the second ground and the signal line; and via holes formed by filling a plurality of trenches, which are formed in a vertical direction such that the first ground and the second ground are electrically connected, with conductors, wherein one side of the conductor is surrounded by the trench to face the signal line in a widthwise direction of the signal line and the other side of the conductor is exposed to the outside, wherein the signal line is laterally bent so as to be spaced apart from positions where the via holes are formed.

The via holes may include a first via hole, a second via hole, and a third via hole which are spaced apart from each other along an extending direction of the signal line, the first via hole may be located at one side of the signal line, the second via hole may be located at the other side of the signal line, the third via hole may be located at the one side of the signal line, and the signal line may be laterally bent so as to be spaced apart from positions where the first via hole, the second via hole, and the third via hole are formed.

The flexible circuit board may further include a shielding portion which is spaced apart from the signal line on the same layer as the signal line and extends in the extending direction of the signal line between the first via hole and the third via hole.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

DETAILED DESCRIPTION

Figure 1:
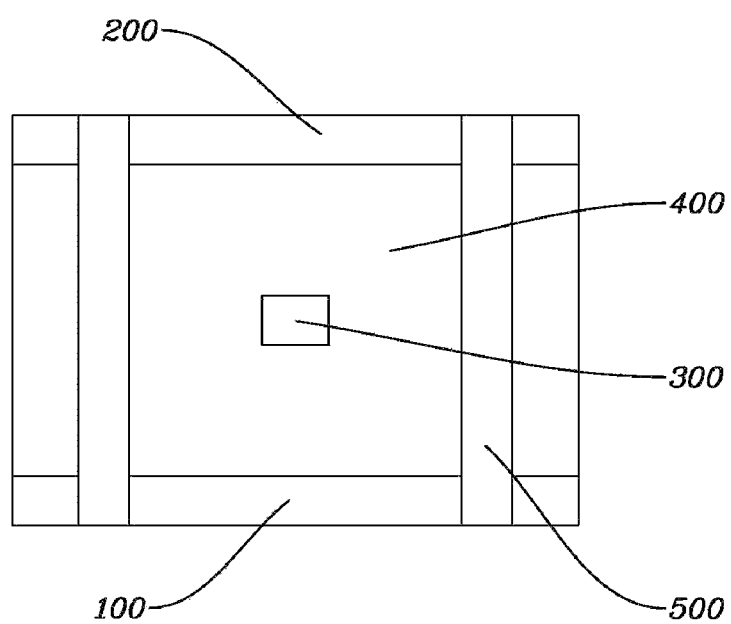
FIGS. 1 and 2 are views illustrating a flexible circuit board.
Figure 2:
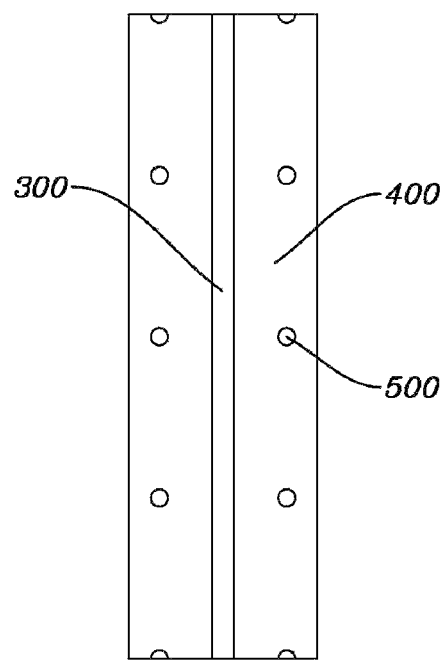

As shown in FIGS. 1 and 2, a flexible circuit board includes a first ground 100, a second ground 200, a signal line 300, a dielectric 400, and via holes 500.

The signal line 300 is disposed between the first ground 100 and the second ground 200.

The dielectric 400 is disposed between the first ground 100 and the signal line 300 and between the second ground 200 and the signal line 300.

The via holes 500 are formed by filling a plurality of holes, which are formed in a vertical direction such that the first ground 100 and the second ground 200 are electrically connected, with conductors.

The via holes 500 are formed in both sides of the signal line 300 interposed therebetween.

The signal line 300 is formed in a straight line in an extending direction thereof.

Figure 3:
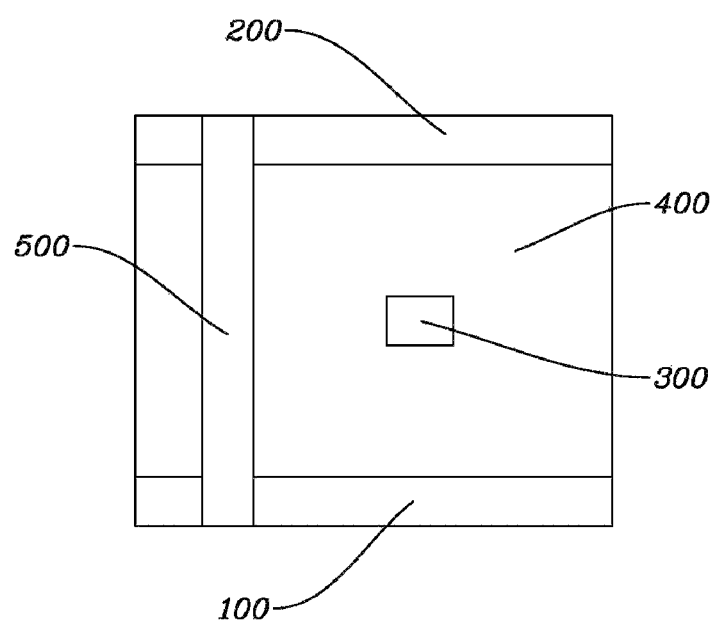
FIGS. 3 and 4 are views illustrating a first example embodiment of the present invention.
Figure 4:
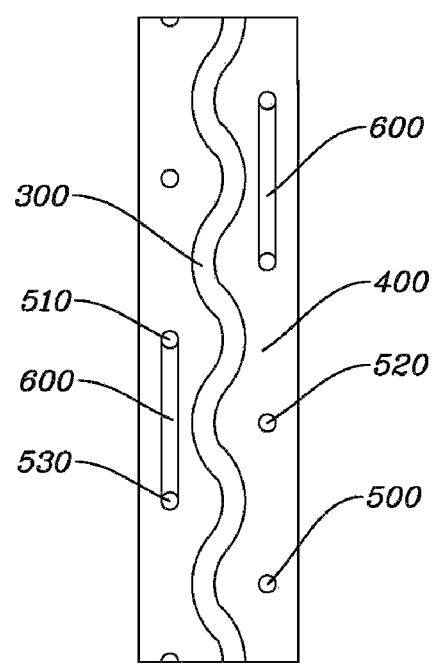

In order for such a flexible circuit board to have a minimum line width, as shown in FIGS. 3 and 4, a first example embodiment of the present invention includes a first ground 100, a second ground 200, a signal line 300, a dielectric 400, and via holes 500.

The signal line 300 is disposed between the first ground 100 and the second ground 200.

The dielectric 400 is disposed between the first ground 100 and the signal line 300 and between the second ground 200 and the signal line 300.

The via holes 500 are formed by filling a plurality of holes, which are formed in a vertical direction such that the first ground 100 and the second ground 200 are electrically connected, with conductors.

The signal line 300 is laterally bent so as to be spaced apart from positions where the via holes 500 are formed.

Specifically describing the bending of the signal line 300, the via holes 500 include a first via hole 510, a second via hole 520, and a third via hole 530 which are spaced apart from each other along an extending direction of the signal line 300.

The first via hole 510 is located at one side of the signal line 300.

The second via hole 520 is located at the other side of the signal line 300.

The third via hole 530 is located at the one side of the signal line 300.

The signal line 300 is laterally bent so as to be spaced apart from positions where the first via hole 510, the second via hole 520, and the third via hole 530 are formed.

As described above, when the signal line 300 is laterally bent and a via hole 500, which is located at a position where the signal line 300 is bent, is moved inward of the signal line 300, a width of the flexible circuit board is reduced by a distance by which the via hole 500 is moved inward.

Figure 5:
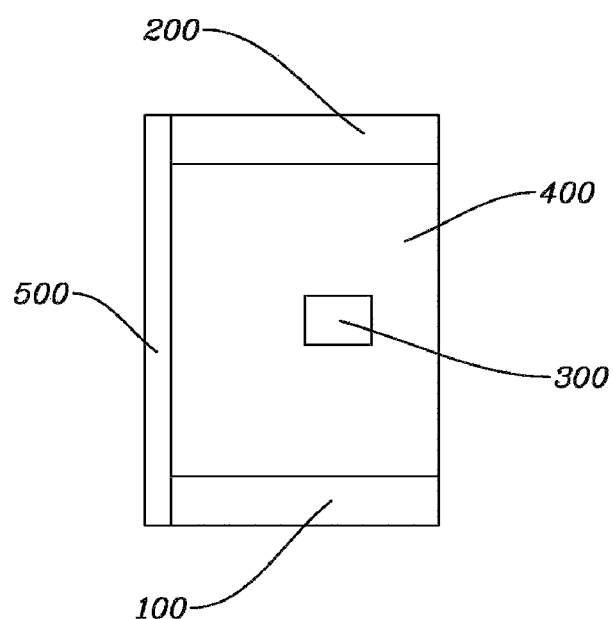
FIGS. 5 and 6 are views illustrating a second example embodiment of the present invention.
Figure 6:
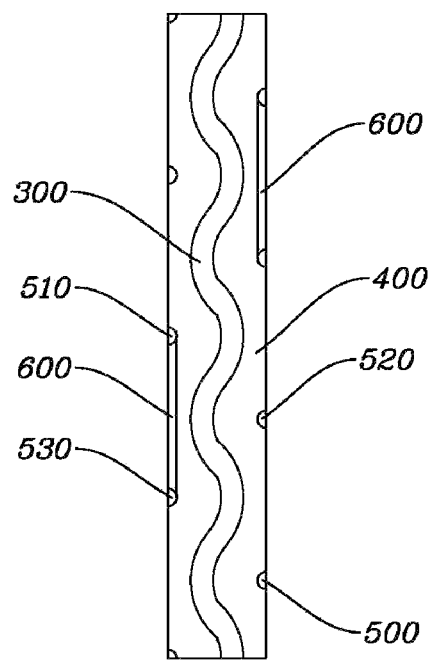

In order for such a flexible circuit board to have a minimum line width, as shown in FIGS. 5 and 6, a second example embodiment of the present invention includes a first ground 100, a second ground 200, a signal line 300, a dielectric 400, and via holes 500.

The signal line 300 is disposed between the first ground 100 and the second ground 200.

The dielectric 400 is disposed between the first ground 100 and the signal line 300 and between the second ground 200 and the signal line 300.

The via holes 500 are formed by filling a plurality of trenches, which are formed in a vertical direction such that the first ground 100 and the second ground 200 are electrically connected, with conductors. One side of the conductor is surrounded by the trench to face the signal line 300 in a widthwise direction of the signal line 300, and the other side of the conductor is exposed to the outside.

The signal line 300 is laterally bent so as to be spaced apart from positions where the via holes 500 are formed.

Components of the second example embodiment excluding the via holes 500 are the same as those of the first example embodiments, and the via hole 500 of the second example embodiment may be formed by cutting the other side of the via hole 500 of the first embodiment along a center of the via hole 500, wherein the other side of the via hole 500 faces the signal line 300.

The via hole 500 of the second example embodiment is cut along the center thereof and is formed in a semicircular shape.

As described above, the other side of the via hole 500, which faces the signal line 300, is cut along the center of the via hole 500, and thus, a width of the flexible circuit board is reduced by a cut width.

The first and second example embodiments may include a shielding portion 600 which is spaced apart from the signal line 300 on the same layer as the signal line 300 and extends in an extending direction of the signal line 300 between the first via hole 510 and the third via hole 530.

When the shielding portion 600 is formed as described above, the shielding portion 600 shields noise from being introduced into a protruding bent portion of the signal line 300.

When the via hole 500, which is located at a position where the signal line 300 is bent, is moved inward of the signal line 300, a width of a flexible circuit board is reduced by a distance by which the via hole 500 is moved inward.

One side of the via hole 500, which faces the signal line 300, is cut along a center of the via hole, and thus, the width of the flexible circuit board is reduced by a cut width.

When the shielding portion 600 is formed, the shielding portion 600 shields noise from being introduced into a protruding bent portion of the signal line 300.

DESCRIPTION OF REFERENCE NUMERALS

| 100: first ground | 200: second ground |
|---|---|
| 300: signal line | 400: dielectric |
| 500: via hole | 510: first via hole |
| 520: second via hole | 530: third via hole |
| 600: shielding portion | |

We claim:

1. A flexible circuit board with a reduced line width, comprising:
    a signal line disposed between a first ground and a second ground;
    a dielectric disposed between the first ground and the signal line and between the second ground and the signal line; and
    via holes formed by filling a plurality of holes, which are formed in a vertical direction such that the first ground and the second ground are electrically connected, with conductors,
    wherein the signal line is laterally bent so as to be spaced apart from positions where the via holes are formed.

2. The flexible circuit board of claim 1, wherein the via holes include a first via hole, a second via hole, and a third via hole which are spaced apart from each other along an extending direction of the signal line,
    the first via hole is located at one side of the signal line,
    the second via hole is located at the other side of the signal line,
    the third via hole is located at the one side of the signal line, and
    the signal line is laterally bent so as to be spaced apart from positions where the first via hole, the second via hole, and the third via hole are formed.

3. The flexible circuit board of claim 2, further comprising a shielding portion which is spaced apart from the signal line on the same layer as the signal line and extends in the extending direction of the signal line between the first via hole and the third via hole.

4. A flexible circuit board with a reduced line width, comprising:
    a signal line disposed between a first ground and a second ground;
    a dielectric disposed between the first ground and the signal line and between the second ground and the signal line; and
    via holes formed by filling a plurality of trenches, which are formed in a vertical direction such that the first ground and the second ground are electrically connected, with conductors, wherein one side of the conductor is surrounded by the trench to face the signal line in a widthwise direction of the signal line and the other side of the conductor is exposed to the outside,
    wherein the signal line is laterally bent so as to be spaced apart from positions where the via holes are formed.

5. The flexible circuit board of claim 4, wherein the via holes include a first via hole, a second via hole, and a third via hole which are spaced apart from each other along an extending direction of the signal line,
    the first via hole is located at one side of the signal line,
    the second via hole is located at the other side of the signal line,
    the third via hole is located at the one side of the signal line, and the signal line is laterally bent so as to be spaced apart from positions where the first via hole, the second via hole, and the third via hole are formed.

6. The flexible circuit board of claim 5, further comprising a shielding portion which is spaced apart from the signal line on the same layer as the signal line and extends in the extending direction of the signal line between the first via hole and the third via hole.

\* \* \* \* \*